US010665637B2

(12) United States Patent
Park et al.

(10) Patent No.: US 10,665,637 B2
(45) Date of Patent: May 26, 2020

(54) COMPLEMENTARY METAL OXIDE SEMICONDUCTOR IMAGE SENSOR AND METHOD OF MANUFACTURING THE SAME

(71) Applicant: SAMSUNG ELECTRONICS CO., LTD., Suwon-si (KR)

(72) Inventors: Kyungbae Park, Hwaseong-si (KR); Wenxu Xianyu, Suwon-si (KR); Bonwon Koo, Suwon-si (KR); Takkyun Ro, Hwaseong-si (KR); Changseung Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/105,259

(22) Filed: Aug. 20, 2018

(65) Prior Publication Data

US 2019/0305049 A1 Oct. 3, 2019

(30) Foreign Application Priority Data

Apr. 2, 2018 (KR) .................... 10-2018-0038210

(51) Int. Cl.
*H01L 27/30* (2006.01)
*H01L 27/146* (2006.01)
*H01L 51/44* (2006.01)

(52) U.S. Cl.
CPC ...... *H01L 27/307* (2013.01); *H01L 27/14621* (2013.01); *H01L 27/14627* (2013.01);
(Continued)

(58) Field of Classification Search
CPC ............ H01L 27/307; H01L 27/14627; H01L 51/441
See application file for complete search history.

(56) References Cited

U.S. PATENT DOCUMENTS

2005/0242271 A1* 11/2005 Weng ................ H01L 27/14621
250/214.1
2006/0023313 A1* 2/2006 Kim .................... G02B 3/0018
359/620
(Continued)

FOREIGN PATENT DOCUMENTS

CN 104201183 A 12/2014
JP 2013-55252 A 3/2013
(Continued)

OTHER PUBLICATIONS

Communication dated Apr. 11, 2019, issued by the European Patent Office in counterpart European Application No. 18195392.8.

*Primary Examiner* — Lex H Malsawma
*Assistant Examiner* — Laura M Dykes
(74) *Attorney, Agent, or Firm* — Sughrue Mion, PLLC

(57) ABSTRACT

Provided are an image sensor and a method of manufacturing the same. The image sensor may include a plurality of light detection elements arranged to correspond to a plurality of pixel regions, a color filter layer on the plurality of light detection elements and including a plurality of color filters arranged to correspond to the plurality of light detection elements, and a photodiode device portion on the color filter layer. The photodiode device portion may have curved structures. The photodiode device portion may include an organic material-based photodiode layer, a first electrode between the photodiode layer and the color filter layer, and a second electrode on the photodiode layer. The photodiode device portion may have curved convex structures respectively corresponding to the plurality of color filters.

27 Claims, 13 Drawing Sheets

(52) U.S. Cl.
CPC .. *H01L 27/14643* (2013.01); *H01L 27/14645* (2013.01); *H01L 27/14667* (2013.01); *H01L 51/44* (2013.01); *H01L 51/441* (2013.01); *H01L 51/448* (2013.01)

(56) References Cited

U.S. PATENT DOCUMENTS

| | | |
|---|---|---|
| 2008/0038862 A1 | 2/2008 | Yin et al. |
| 2009/0046185 A1* | 2/2009 | Ota ................... H04N 5/23232 348/294 |
| 2009/0206434 A1* | 8/2009 | Hashimoto ....... H01L 27/14623 257/432 |
| 2011/0049591 A1* | 3/2011 | Nakatani ............... H01L 27/307 257/292 |
| 2014/0138665 A1* | 5/2014 | Takizawa .......... H01L 27/14627 257/40 |
| 2015/0228920 A1* | 8/2015 | Benwadih ............. H01L 51/447 257/40 |
| 2016/0049449 A1 | 2/2016 | Kim et al. |
| 2016/0133865 A1* | 5/2016 | Yamaguchi ....... H01L 27/14623 257/40 |
| 2016/0197122 A1 | 7/2016 | Ryuichi et al. |
| 2017/0053969 A1 | 2/2017 | Roh et al. |
| 2017/0104162 A1 | 4/2017 | Rosselli et al. |
| 2017/0250226 A1 | 8/2017 | Kim et al. |
| 2017/0358614 A1* | 12/2017 | Azami ............. H01L 27/14605 |
| 2018/0374903 A1* | 12/2018 | Otake ..................... H01L 27/14 |
| 2019/0043911 A1 | 2/2019 | Honda et al. |

FOREIGN PATENT DOCUMENTS

| | | | |
|---|---|---|---|
| JP | 2013055252 A | * | 3/2013 |
| JP | 2017-120276 A | | 7/2017 |
| JP | 2017-152511 A | | 8/2017 |
| KR | 10-1018970 B1 | | 3/2011 |
| KR | 10-2016-0084162 A | | 7/2016 |
| KR | 10-2017-0022177 A | | 3/2017 |

* cited by examiner

COMPLEMENTARY METAL OXIDE SEMICONDUCTOR IMAGE SENSOR AND METHOD OF MANUFACTURING THE SAME

CROSS-REFERENCE TO RELATED APPLICATION

This application claims priority from Korean Patent Application No. 10-2018-0038210, filed on Apr. 2, 2018, in the Korean Intellectual Property Office, the disclosure of which is incorporated herein in its entirety by reference.

BACKGROUND

1. Field

Example embodiments set forth herein relate to image sensors, methods of manufacturing the same, and optical devices including the image sensors.

2. Description of the Related Art

Generally, color display devices display images in various colors or color image sensors sense the color of incident light. In this case, both color display devices and color image sensors may use color filters. In color display devices or color image sensors currently in use, an RGB color filter method is generally employed, in which, for example, green filters are arranged on two pixels among four pixels and blue and red filters are arranged on the other two pixels. In addition to the RGB color filter method, a CYGM color filter method is employed, in which cyan, yellow, green, and magenta filters are respectively arranged on four pixels.

With the advancement of image sensor technology, the sizes of unit pixels are decreasing, thereby resulting in problems such as a reduction in the intensity of a signal input to or output from a sensor and an increase in crosstalk. When RGB color filters are two-dimensionally arranged, problems caused by a reduction in pixel size, such as a decrease in sensitivity and optical loss, may become serious. Accordingly, there is a need to develop a next-generation image sensor capable of overcoming problems caused by a reduction in pixel size, such as a reduction in the intensity of a signal to be input or output, a decrease in sensitivity, etc.

SUMMARY

One or more example embodiments provide an image sensor capable of improving sensitivity and increasing the intensity of a signal to be input or output, and a method of manufacturing the same. Also provided are an image sensor capable of improving sensitivity by increasing an effective light-receiving area and a method of manufacturing the same. Further provided are an image sensor capable of enhancing external quantum efficiency (EQE) and a method of manufacturing the same. Also provided are an image sensor that may be manufactured using a relatively simple process and a method of manufacturing the same.

According to an aspect of an example embodiment, there is provided an image sensor including a plurality of light detection elements arranged to correspond to a plurality of pixel regions, a color filter layer arranged on the plurality of light detection elements, the color filter layer including a plurality of color filters arranged to correspond to the plurality of light detection elements, and a photodiode device portion arranged on the color filter layer, the photodiode device portion including a plurality of curved convex structures respectively corresponding to the plurality of color filters, wherein the photodiode device portion includes an organic material-based photodiode layer, a first electrode arranged between the photodiode layer and the color filter layer, and a second electrode arranged on the photodiode layer.

The first electrode may include a plurality of first electrode elements patterned to correspond to each of the plurality of pixel regions, the photodiode layer and the second electrode including a continuous layer structure, respectively, arranged on the plurality of color filters.

The color filter layer may further include a plurality of first conductive plugs and a second conductive plug, wherein the plurality of first conductive plugs are respectively arranged in the plurality of pixel regions, and the second conductive plug is spaced apart from the plurality of first conductive plugs, the plurality of first electrode elements are respectively connected to the plurality of first conductive plugs, and the second electrode is connected to the second conductive plug.

The first electrode may include a plurality of first electrode elements patterned to correspond to each of the plurality of pixel regions, wherein each of the plurality of first electrode elements includes a first electrode layer having a flat structure, and a second electrode layer having a curved structure corresponding to a pixel region, the second electrode layer being connected to the first electrode layer, and wherein the image sensor further includes a micro-lens between the first electrode layer and the second electrode layer.

The micro-lens may include a low-temperature oxide (LTO).

The first electrode layer and the second electrode layer may be in contact with each other at a first side of the micro-lens while overlapping each other by a first width, the first electrode layer and the second electrode layer may be in contact with each other at a second side of the micro-lens while overlapping each other by a second width or are not in contact with each other at the second side of the micro-lens.

The first electrode may include a plurality of first electrode elements patterned to correspond to each of the plurality of pixel regions, wherein a curved convex surface corresponding to one of the plurality of pixel regions is provided as a top surface of each of the plurality of first electrode elements.

The first electrode may include a plurality of first electrode elements patterned to correspond to each of the plurality of pixel regions, wherein a plurality of curved convex surfaces corresponding to one of the plurality of pixel regions are provided as a top surface of each of the plurality of first electrode elements.

The image sensor may further include an encapsulation layer covering the photodiode device portion, wherein the encapsulation layer may include at least two different material layers and include curved surfaces corresponding to the curved convex structures of the photodiode device portion.

The plurality of color filters may include a first color filter and a second color filter, wherein the first color filter includes a red filter, the second color filter includes a blue filter, and the photodiode layer includes a green-sensing photodiode layer.

The plurality of light detection elements may include a plurality of silicon-based photodiodes.

The image sensor may include a complementary metal oxide semiconductor (CMOS) image sensor.

The image sensor may further include a substrate portion including a plurality of transistors, and a connection wiring layer between the substrate portion and the color filter layer, wherein at least some of the plurality of transistors are electrically connected to the photodiode device portion.

An imaging device may include the image sensor.

According to an aspect of an example embodiment, there is provided a method of manufacturing an image sensor, the method including preparing a substrate layer including a plurality of light detection elements corresponding to a plurality of pixel regions, forming a color filter layer on the substrate layer, the color filter layer including a plurality of color filters arranged to correspond to the plurality of light detection elements, and forming a photodiode device portion on the color filter layer, the photodiode device portion including curved convex structures respectively corresponding to the plurality of color filters, wherein the forming of the photodiode device portion includes forming a first electrode including curved structures on the color filter layer, forming an organic material-based photodiode layer on the first electrode, and forming a second electrode on the photodiode layer.

The forming of the first electrode may include forming the first electrode including a plurality of first electrode elements patterned corresponding to each of the plurality of pixel regions, and the forming of the photodiode layer and the forming of the second electrode may include forming the photodiode layer and the second electrode including a continuous layer structure, respectively, arranged on the plurality of color filters.

The method may further include forming a plurality of first conductive plugs and a second conductive plug in the color filter layer such that the plurality of first conductive plugs are respectively arranged in the plurality of pixel regions and the second conductive plug is spaced apart from the plurality of first conductive plugs, wherein the plurality of first electrode elements are formed respectively connected to the plurality of first conductive plugs, and the forming of the second electrode including the continuous layer structure includes forming the second electrode connected to the second conductive plug.

The forming of the first electrode may include forming the first electrode including a plurality of first electrode elements patterned corresponding to each of the plurality of pixel regions, wherein each of the plurality of first electrode elements may include a first electrode layer having a flat structure, and a second electrode layer including a curved structure and connected to the first electrode layer, wherein the image sensor may further include a micro-lens between the first electrode layer and the second electrode layer.

The method may further include forming a plurality of first electrode layers on the color filter layer, the plurality of first electrode layers respectively corresponding to the plurality of color filters, forming an intermediate material layer on the plurality of first electrode layers, forming a mask pattern on the intermediate material layer, forming a plurality of micro-lenses on the plurality of first electrode layers by patterning the intermediate material layer by using the mask pattern as an etch mask, forming a plurality of second electrode layers on the plurality of micro-lenses, forming the photodiode layer arranged on the plurality of second electrode layers, and forming the second electrode on the photodiode layer.

The intermediate material layer may include a low-temperature oxide (LTO).

The forming of the first electrode may include forming the first electrode including a plurality of first electrode elements patterned corresponding to each of the plurality of pixel regions, wherein each of the plurality of first electrode elements is formed including a curved convex surface as a top surface, the curved convex surface corresponding to one of the plurality of pixel regions.

The forming of the first electrode may include forming the first electrode including a plurality of first electrode elements patterned corresponding to each of the plurality of pixel regions, wherein each of the plurality of first electrode elements is formed including a plurality of curved convex surfaces as a top surface, the plurality of curved convex surfaces corresponding to one of the plurality of pixel regions.

The method may further include forming an encapsulation layer covering the photodiode device portion, wherein the encapsulation layer includes at least two different material layers and includes curved surfaces corresponding to the curved convex structures of the photodiode device portion.

The image sensor, wherein a curved structure of the second electrode layer may include a plurality of curved convex surfaces.

The first width may be equal to or greater than the second width.

The plurality of first electrode elements may include a single body structure.

The first electrode and the second electrode may include a transparent conductive oxide.

According to an aspect of an example embodiment, there is provided an image sensor including a plurality of light detection elements arranged to correspond to a plurality of pixel regions, a color filter layer arranged on the plurality of light detection elements, the color filter layer including a plurality of color filters arranged to correspond to the plurality of light detection elements, and a photodiode device portion arranged on the color filter layer, the photodiode device portion including a plurality of curved convex structures respectively corresponding to the plurality of color filters, wherein the photodiode device portion includes an organic material-based photodiode layer, a first electrode arranged between the photodiode layer and the color filter layer, the first electrode including a micro-lens, and a second electrode arranged on the photodiode layer.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
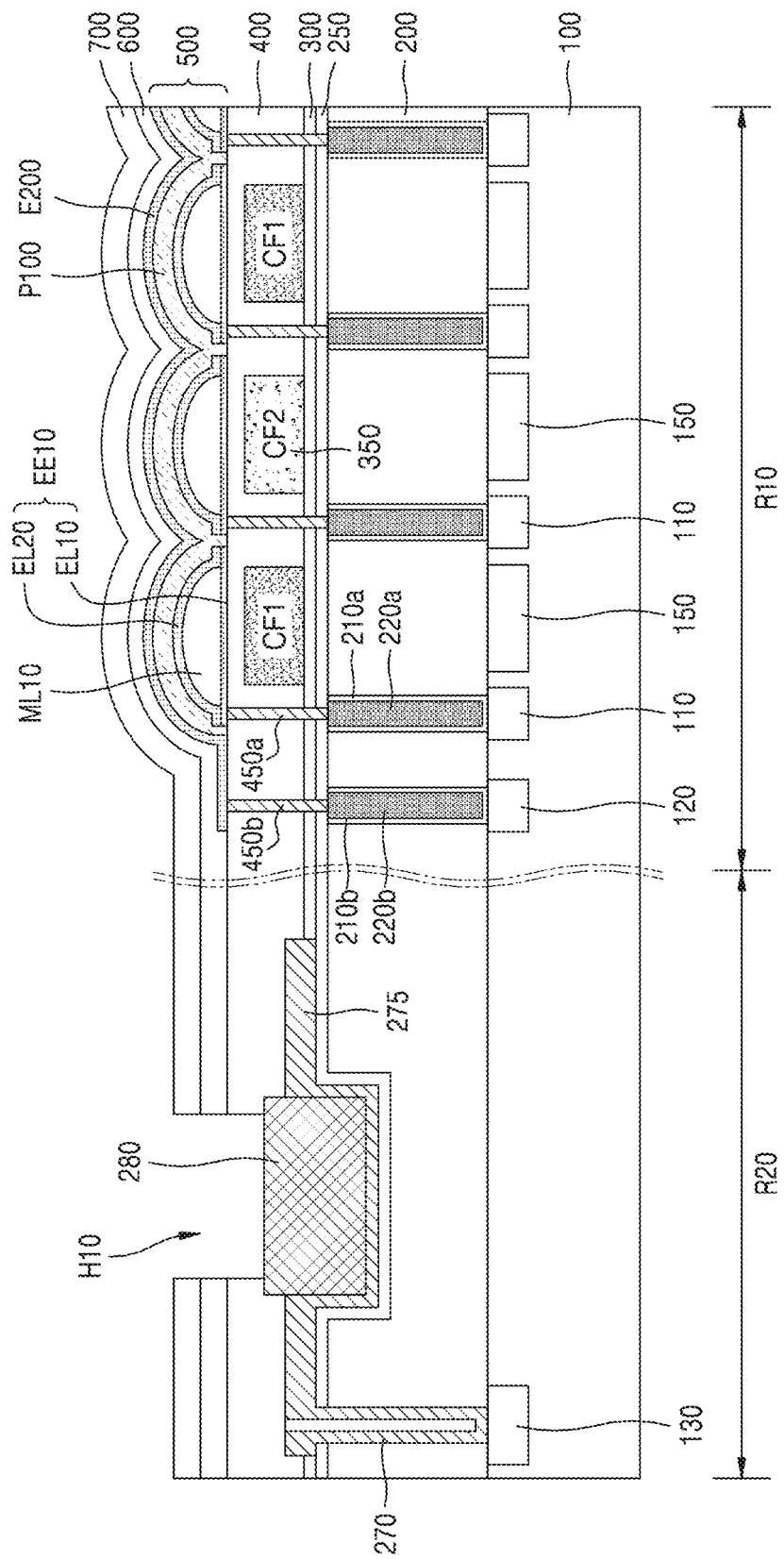
FIG. 1 is a cross-sectional view of an image sensor according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, an image sensor, a method of manufacturing the same, and an imaging device including the image sensor according to example embodiments will be described in greater detail with reference to the accompanying drawings. A width and thickness of each layer or region illustrated in the drawings may be exaggerated for clarity and convenience of explanation. Throughout the specification, the same reference numeral denotes the same element.

FIG. 1 is a cross-sectional view of an image sensor according to an example embodiment.

Referring to FIG. 1, the image sensor may include an active region R10 and a peripheral region R20. The active region R10 may include a plurality of light detection elements 150 arranged to correspond to a plurality of pixel regions, and a plurality of color filters 350 arranged on the plurality of light detection elements 150 to correspond to the plurality of light detection elements 150. The plurality of color filters 350 may form a color filter layer. A photodiode device portion 500 may be provided on the plurality of color filters 350. The photodiode device portion 500 may include a photodiode layer P100 containing an organic material, a first electrode provided between the photodiode layer P100 and the plurality of color filters 350, and a second electrode E200 provided on the photodiode layer P100. Here, the first electrode may include a plurality of first electrode elements EE10 patterned in units of pixels. The photodiode device portion 500 may have curved convex structures corresponding to the plurality of color filters 350.

A structure of the active region R10 will be described in more detail.

A substrate layer 100 may be provided, and a plurality of transistors 110 and 120 may be provided in the substrate layer 100. The plurality of transistors 110 and 120 may include a plurality of first transistors 110 and at least one second transistor 120. The substrate layer 100 may include a plurality of light detection elements 150 arranged to correspond to the plurality of pixel regions. The plurality of light detection elements 150 may be photodiodes or phototransistors. For example, the plurality of light detection elements 150 may be silicon (Si)-based photodiodes. In this case, the plurality of transistors 110 and 120 may be silicon (Si)-based transistors. Referring to FIG. 1, an example in which the plurality of transistors 110 and 120 and the plurality of light detection elements 150 are provided at the same level on the same substrate layer 100 is illustrated, but example embodiments are not limited thereto, and the plurality of transistors 110 and 120 and the plurality of light detection elements 150 may be formed on different substrates or at different levels. The substrate layer 100 may further include a capacitor, a wiring, etc.

A first insulating layer 200 may be provided on the substrate layer 100. A plurality of contact plugs 220a and 220b may be included in the first insulating layer 200. The plurality of contact plugs 220a and 220b may include a plurality of first contact plugs 220a and at least one second contact plug 220b. The plurality of first contact plugs 220a may be electrically connected to the plurality of first transistors 110. The at least one second contact plug 220b may be electrically connected to the at least one second transistor 120. Conductive adhesive layers 210a and 210b may be provided between the plurality of contact plugs 220a and 220b and the first insulating layer 200. The first adhesive layers 210a may be provided between the first contact plug 220a and the first insulating layer 200. The second adhesive layers 210b may be provided between the at least one second contact plug 220b and the first insulating layer 200. The first insulating layer 200 including the plurality of contact plugs 220a and 220b may form a connection wiring layer (interconnection layer).

An anti-reflective layer 250 may be provided on the first insulating layer 200. The anti-reflective layer 250 is located below the plurality of color filters 350 and may be thus referred to as a bottom anti-reflective layer (BARL). The anti-reflective layer 250 may be formed of a general anti-reflective material.

A second insulating layer 300 may be provided on the anti-reflective layer 250, and the plurality of color filters 350 may be provided on the second insulating layer 300. A third insulating layer 400 may be provided on the plurality of color filters 350 to cover the plurality of color filters 350. According to an example embodiment, the second insulating layer 300 may not be included and the plurality of color filters 350 may be formed on the anti-reflective layer 250. The plurality of color filters 350 may include a plurality of first color filters CF1 and a plurality of second color filters CF2. The plurality of first color filters CF1 and the plurality of second color filters CF2 may two-dimensionally form an array. For example, the plurality of first color filters CF1 may be red filters and the plurality of second color filters CF2 may be blue filters, but example embodiments are not limited thereto and colors to be filtered by the first and second color filters CF1 and CF2 may vary. A plurality of conductive plugs 450a and 450b may be provided in the third insulating layer 400 and the second insulating layer 300 to pass through the third insulating layer 400 and the second insulating layer 300. The plurality of conductive plugs 450a and 450b may include a plurality of first conductive plugs 450a and at least one second conductive plug 450b. The plurality of first conductive plugs 450a may be arranged to correspond to the plurality of pixel regions. The plurality of first conductive plugs 450a may be respectively connected to the plurality of first contact plugs 220a to be electrically connected to the plurality of first transistors 110. The at least one second conductive plug 450b may be connected to the at least one second contact plug 220b to be electrically connected to the at least one second transistor 120.

The photodiode device portion 500 may be provided on the third insulating layer 400. The photodiode device portion 500 may include a plurality of first electrode elements EE10 patterned in units of pixels, an organic material (organic semiconductor)-based photodiode layer P100 covering the plurality of first electrode elements EE10, and a second electrode E200 provided on the photodiode layer P100. Each of the plurality of first electrode elements EE10 may include, for example, a first electrode layer EL10 having a flat structure, and a second electrode layer EL20 connected to the first electrode layer EL10 and having a curved structure. A micro-lens ML10 may be provided between the first electrode layer EL10 and the second electrode layer EL20. The micro-lens ML10 may have a convex shape and thus the second electrode layer EL20 formed thereon may have a curved structure. The photodiode layer P100 and the second electrode E200 may have continuous layer structures covering the plurality of color filters 350. The first electrode element EE10 and the second electrode 200 may be formed of, for example, a transparent conductive oxide (TCO), such as an indium tin oxide (ITO), an indium zinc oxide (IZO), an aluminum zinc oxide (AZO), a gallium zinc oxide (GZO), an aluminum gallium zinc oxide (AGZO), or a gallium indium zinc oxide (GIZO). The photodiode layer P100 may contain, for example, a green-sensing photodiode material (organic material), and have a PN structure or a PIN structure. When the first color filter CF1 is a red (R) filter and the second color filter CF2 is a blue (B) filter, the photodiode layer P100 may be a green (G)-sensing photodiode and RGB colors may be sensed from a combination thereof. However, example embodiments are not limited thereto, and the color combination related to the first color filter CF1, the second color filter CF2 and the photodiode layer P100 may vary. According to example embodiments, the photodiode layer P100 may contain a red or blue sensing material. The micro-lens ML10 may be formed of a transparent insulating material such as a silicon oxide (SiO). For example, the micro-lens ML10 may contain a low-temperature oxide (LTO). The LTO may be, for example, an oxide formed at about 500° C. or less. According to example embodiments, the micro-lens ML10 may be formed of an organic material such as a polymer or a conductor. The micro-lens ML10 may contain a transparent oxide such as silicon nitride (SiNx), silicon oxynitride (SiON), or titanium oxide (TiOx) or a conductive material such as ITO, zinc oxide (ZnO), IZO, or AZO.

Each of the plurality of first electrode layers EL10 may be connected to and be in contact with the first conductive plug 450a below the first electrode layer EL10, and electrically connected to the first transistor 110. Thus, a signal may be independently sensed for each of the pixel regions. After the first electrode layer EL10 comes into contact with the first conductive plug 450a, the micro-lens ML10 is formed on the first electrode layer EL10, and the second electrode layer EL20 is formed on the micro-lens ML10 to be electrically connected to and to be in contact with the first electrode layer EL10. Accordingly, a contact margin for the first conductive plug 450a may be improved and a process of forming the micro-lens ML10 may be easier. The second electrode E200 may have a continuous layer structure and be connected to and be in contact with the second conductive plug 450b. Since the second electrode E200 is not patterned in units of pixels but is connected to the second conductive plug 450b, a pixel structure may be more simplified, an effective region of each pixel may be increased, and a manufacturing process may be simplified. The second electrode E200 may be electrically connected to the second transistor 120 through the second conductive plug 450b.

The photodiode device portion 500 has a curved convex structure corresponding to each of the plurality of color filters 350. Thus, an effective light-receiving area (i.e., an active area) of each pixel may increase, a photocurrent of a device may increase, and sensitivity may be improved. Furthermore, a stacked structure in which the plurality of color filters 350 and the photodiode layer P100 are arranged at different layers may be provided, and which may increase a light receiving area and improve sensitivity of the image sensor. According to an example embodiment, the sensitivity and optical efficiency of an image sensor may be increased and the intensity of a signal to be input or output may be improved.

Referring to FIG. 1, the image sensor may include encapsulation layers 600 and 700 covering the photodiode device portion 500. The encapsulation layers 600 and 700 may include at least two different material layers. For example, the encapsulation layers 600 and 700 may include a first encapsulation layer 600 and a second encapsulation layer 700 formed of a material different from that of the first encapsulation layer 600. For example, the first encapsulation layer 600 may be formed of an aluminum oxide (Al2O3), and the second encapsulation layer 700 may be formed of a silicon oxynitride (SiON). Encapsulation performance may be improved by a two-layer or multi-layer structure. The encapsulation layers 600 and 700 may have curved surfaces corresponding to a curved structure of the photodiode device portion 500. Thus, the encapsulation layers 600 and 700 may also function as a micro-lens and thus an additional micro-lens may not need to be provided thereon. Accordingly, the manufacturing process may be more simplified and light collecting/focusing characteristics of the image sensor may be improved.

In the peripheral region R20, a third transistor 130 may be included in the substrate layer 100 and a third conductive plug 270 electrically connected to the third transistor 130 may be included in the first insulating layer 200. Furthermore, a conductive extension part 275 extending from the third conductive plug 270 may be provided. A pad part 280 which is in contact with the conductive extension part 275 may be further provided. The pad part 280 may be arranged in a certain recessed region formed in the first insulating layer 200. An opening H10 exposing the pad part 280 may be formed by removing some regions of the encapsulation layers 600 and 700 and the third insulating layer 400. The third conductive plug 270 and the extension part 275 may include, for example, a conductor which may be formed of a metal material such as tungsten (W). The pad part 280 may include, for example, a conductor which may be formed of a metal material such as aluminum (Al). The first and second conductive plugs 450a and 450b in the active region R10 may be also formed of, for example, a conductor which may be formed of a metal material such as tungsten (W). However, example embodiments are not limited thereto, and materials of the conductive plugs 450a, 450b, and 270 and the pad part 280 may be variously changed. The structure of the peripheral region R20 described herein is an example and may be thus variously changed according to example embodiments.

The image sensor according to an example embodiment may be a complementary metal oxide semiconductor (CMOS) image sensor, i.e., a CIS. The image sensor may include an organic photodiode (OPD) (i.e., the photodiode layer P100) or an organic semiconductor (OSC), and may be an organic CIS. The image sensor may include the photodiode layer P100 having the curved structure and may be a curved organic photodiode CIS.

Figure 2:
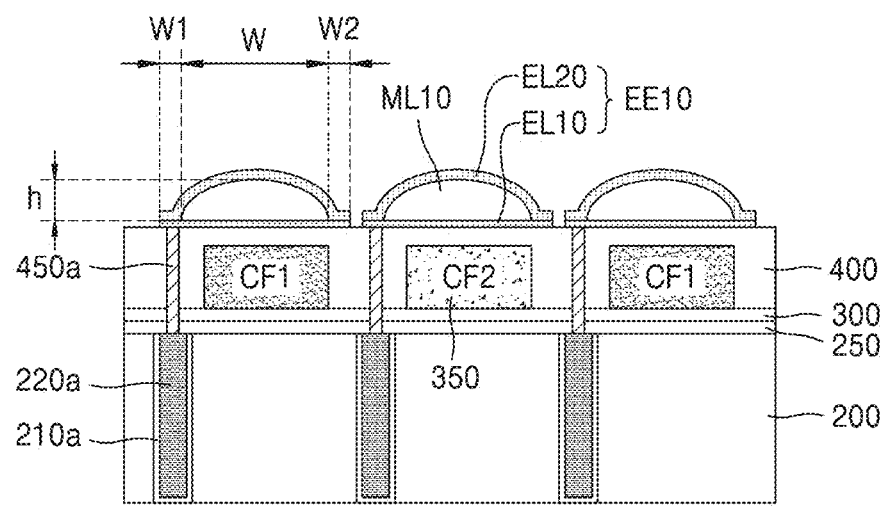
FIG. 2 is a cross-sectional view of a portion of an image sensor according to an example embodiment.

FIG. 2 is a cross-sectional view of a part of an image sensor according to an example embodiment.

Referring to FIG. 2, a first electrode layer EL10 and a second electrode layer EL20 may be in contact with each other at one side of a micro-lens ML10 while overlapping each other by a first width W1. The first electrode layer EL10 and the second electrode layer EL20 may be in contact with each other at another side of the micro-lens ML10 while overlapping each other by a second width W2. In this case, the first width W1 and the second width W2 may be the same or substantially the same. In other words, the first electrode layer EL10 and the second electrode layer EL20 may be formed to be symmetric (or be almost symmetrical with respect to the micro-lens ML10.

In addition, the micro-lens ML10 may be controlled to have an overall soft curved shape through control of fill factors (F/F). In particular, the micro-lens ML10 may be controlled to have softened edge portions rather than angular edge portions. Accordingly, the second electrode layer EL20 formed on the micro-lens ML10 may also have a soft curved shape, and thus an electric filed may be prevented from being concentrated on the edge portions thereof. A ratio (w:h) between a width w and a height h of the micro-lens ML10 may be determined to be in a range of about 2:1 to about 20:1.

Figure 3:
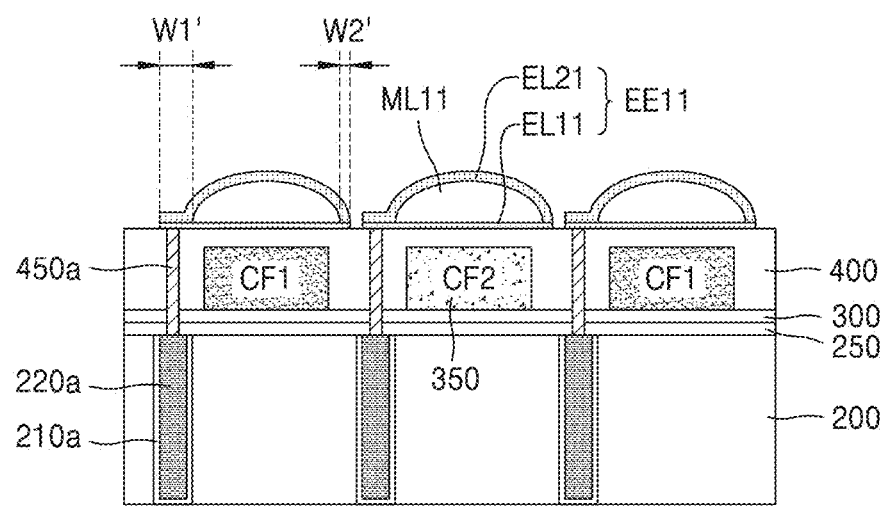
FIG. 3 is a cross-sectional view of a portion of an image sensor according to an example embodiment.

FIG. 3 is a cross-sectional view of a part of an image sensor according to an example embodiment.

Referring to FIG. 3, a first electrode element EE11 may include a first electrode layer EL11 and a second electrode layer EL21, and a micro-lens ML11 may be arranged between the first electrode layer ELI 1 and the second electrode layer EL21. The first electrode layer ELI 1 and the second electrode layer EL21 may be in contact with each other at one side of the micro-lens ML11 while overlapping each other by a first width W1', and may be in contact with each other at another side of the micro-lens ML11 while overlapping each other by a second width W2' or may not be in contact with each other at the other side of the micro-lens ML11. Here, the first width W1' and the second width W2' may be different. The first width W1' may be greater than the second width W2'. A contact margin between the first electrode layer EL11 and the second electrode layer EL21 may be increased by intentionally increasing a contact area between the first electrode layer ELI 1 and the second electrode layer EL21 at the one side of the micro-lens ML11. Furthermore, a center alignment between the micro-lens ML11 and a color filter 350 corresponding thereto may be improved. In an example embodiment, the first electrode layer ELI 1 and the second electrode layer EL21 may be formed to be asymmetric with respect to the micro-lens ML11.

In the example embodiments of FIGS. 2 and 3, each of the first electrode elements EE10 and EE11 may include a curved convex surface corresponding to one of pixel regions on a top surface thereof. In an example embodiment, each of the first electrode elements EE10 and EE11 may include a plurality of curved convex surfaces corresponding to one of pixel regions on a top surface thereof as illustrated in FIG. 4.

Figure 4:
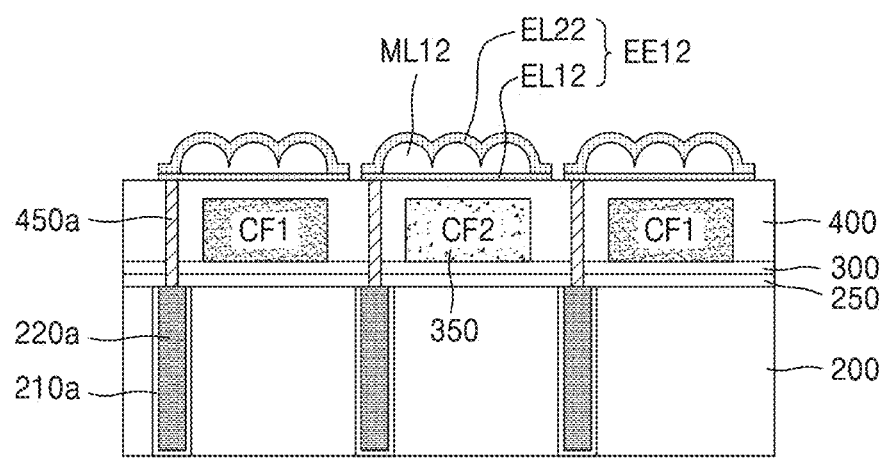
FIG. 4 is a cross-sectional view of a portion of an image sensor according to an example embodiment.

FIG. 4 is a cross-sectional view of a part of an image sensor according to an example embodiment.

Referring to FIG. 4, each of first electrode elements EE12 may include a first electrode layer EL12 and a second electrode layer EL22, and a micro-lens ML12 may be arranged between the first electrode layer EL12 and the second electrode layer EL22. Each of the first electrode elements EE12 may include a plurality of curved convex surfaces corresponding to one of pixel regions on a top surface thereof. Each of the micro-lenses ML12 may have a plurality of curved convex surfaces in one of the pixel regions. Thus, the second electrode layer EL22 may have a plurality of convex portions. In this case, an effective light-receiving area of each pixel may be more increased.

Figure 5:
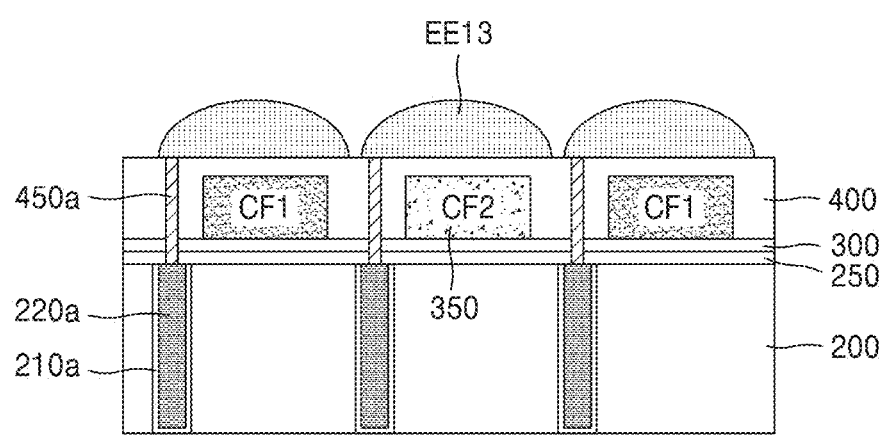
FIG. 5 is a cross-sectional view of a portion of an image sensor, according to an example embodiment.

FIG. 5 is a cross-sectional view of a part of an image sensor according to an example embodiment.

Referring to FIG. 5, each of first electrode elements EE13 may have a single body structure and have a shape of a micro-lens. An effect of a micro-lens may be obtained using the first electrode elements EE13 without additionally providing a micro-lens. That is, the first electrode elements EE13 which are patterned may be used as a micro-lens.

Figure 6:
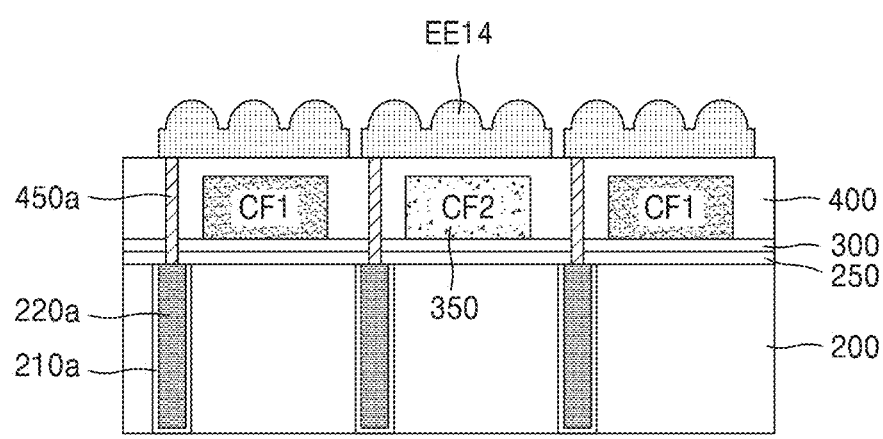
FIG. 6 is a cross-sectional view of a portion of an image sensor, according to an example embodiment.

FIG. 6 is a cross-sectional view of a part of an image sensor according to an example embodiment.

Referring to FIG. 6, each of first electrode elements EE14 may include a plurality of convex portions corresponding to one of pixel regions. Each of the first electrode elements EE14 may have a single body structure and have a shape of a lens with a plurality of convex portions.

Figure 7:
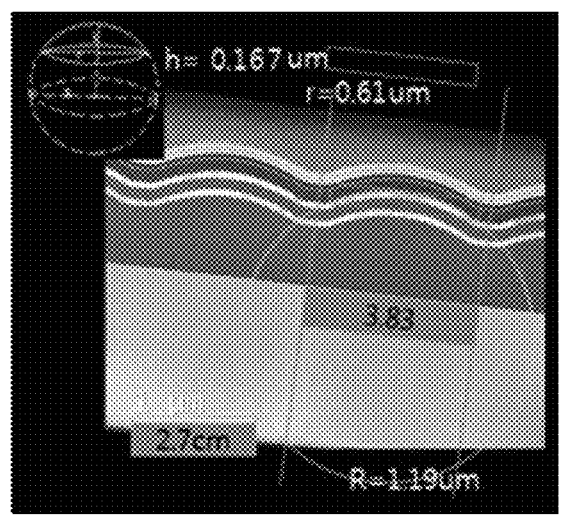
FIG. 7 is a photograph showing cross-sections of a micro-lens formed by an example method and a photodiode device portion having a curved structure and formed on the micro-lens according to an example embodiment.

FIG. 7 is a photograph showing cross sections of a micro-lens formed and a photodiode device portion having a curved structure and formed on the micro-lens according to an example embodiment. Referring to FIG. 7, the radius of the micro-lens is 0.61 μm, diameter is around 1.19 μm, and height is around 0.167 μm.

Referring to FIG. 7, an effective light-receiving area of the photodiode device portion having the curved structure is greater than that of a photodiode device portion having a flat structure and having the same projected area as that of the curved photodiode device portion, as will be described in more detail with reference to FIG. 8 below.

Figure 8:
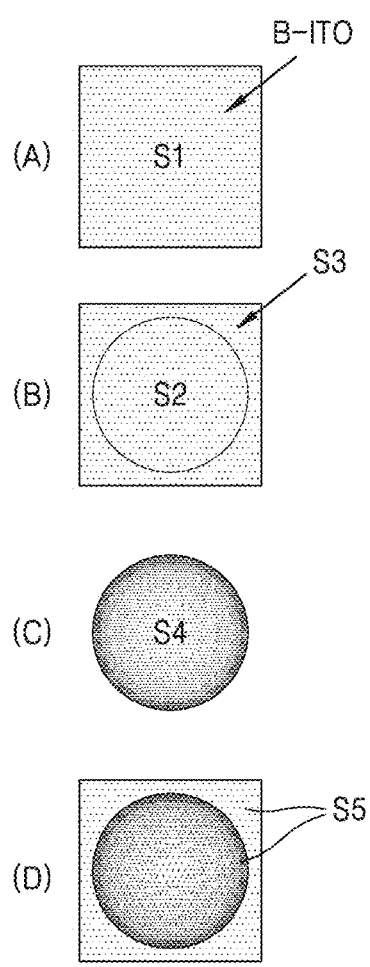
FIG. 8 is a plan view illustrating a difference in an effective area of a curved electrode compared to that of a flat electrode.

FIG. 8 is a plan view for explaining how an effective area of a curved electrode is increased compared to that of a flat electrode according to the example embodiment as illustrated in FIG. 7.

In FIG. 8(A), an area S1 per flat pixel is 1.2 μm×1.2 μm=1.44 μm², where the length of the sides of area S1 are 1.2 μm and 1.2 μm.

In FIG. 8(B), an area S2 of a base side of a micro-lens is $\pi r^2$=3.14×0.61 μm×0.61 μm=1.172 μm². A remaining area S3 obtained by subtracting the area S2 from the area S1 is 1.44−1.172=0.268 μm².

In FIG. 8(C), an area S4 of a curved electrode is $2\pi Rh$=2×3.14×1.19 μm×0.167 μm=1.246 μm².

In FIG. 8(D), an area S5 which is the sum of the areas S4 and S3 is (S4+S3)=1.246 μm²+0.268 μm²=1.514 μm².

Thus, the difference between the areas of the flat pixel and the curved pixel is (S5−S1)×100/S1=5.1%. That is, when projected areas thereof are the same, the area of the curved pixel may be greater by about 5.1% than that of the flat pixel. However, the difference is merely an example and may increase according to a dimension, e.g., a curvature, of the curved pixel. As described above, the curved pixel has a larger effective area than that of the flat pixel, and thus may improve sensitivity, an increase in the intensity of a signal to be input or output, and enhance external quantum efficiency (EQE) of the image sensor.

Figure 9:
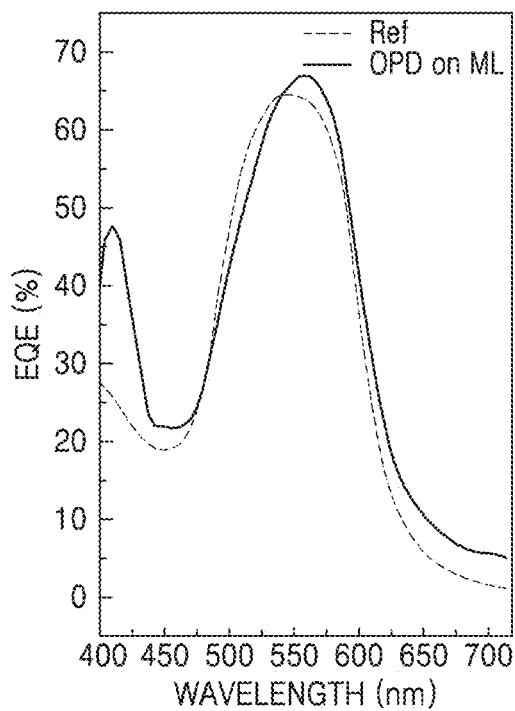
FIG. 9 is a graph showing a result of measuring external quantum efficiency (EQE) characteristics of photodiode device portions according to an example embodiment and a related example.

FIG. 9 is a graph showing a result of measuring EQE characteristics of photodiode device portions according to an example embodiment and a related example of a flat OPD cell. Here, a device according to an example embodiment (illustrated as a straight line indicated by 'OPD on ML') is a curved OPD cell, and a device according to a related example (illustrated in dotted line indicated by 'Ref') is a flat OPD cell.

Figure 10:
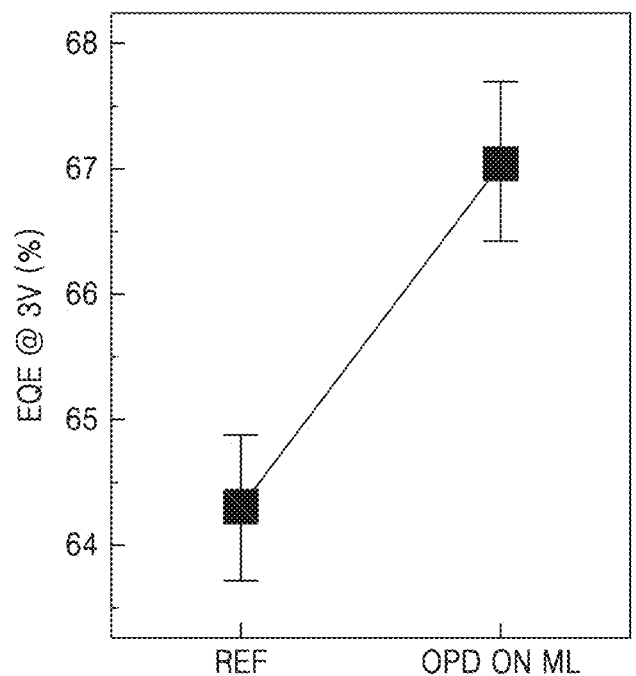
FIG. 10 is a graph showing a result of comparing EQEs of photodiode device portions according to the example embodiment and the related example of FIG. 9 at 3V.

FIG. 10 is a graph showing EQEs of photodiode device portions according to the example embodiment and the comparative example of FIG. 9 at 3V.

Referring to FIGS. 9 and 10, the EQE of the curved OPD cell 'OPD on ML' according to the example embodiment was improved by about 4.4% than that of the flat OPD cell Ref according to the comparative example.

Table 1 below shows statistics obtained by measuring EQE of each of ten curved OPD cells 'OPD on ML' according to the example embodiment and ten flat OPD cells 'Ref' according to the comparative example. Table 1 also shows a full-width-at-half maximum (FWHM) and a maximum wavelength λmax.

TABLE 1

|  | EQE (%) | FWHM | λmax |
|---|---|---|---|
| Ref | 64.3 ± 0.6 | 110 nm | 550 nm |
| OPD on ML | 67.1 ± 0.6 | 105 nm | 555 nm |

According to the example embodiments, an image sensor having an OPD having higher sensitivity characteristics may be manufactured. Furthermore, a micro-lens may be formed by a more simplified method, an OPD may be formed on the micro-lens, and a micro-lens may not need to be additionally formed on the OPD. Thus, a whole manufacturing process may be more simplified. Since the OPD has a shape of a micro-lens, a three-dimensional (3D) structure with an increased area to receive light may be realized. In addition, when a lower electrode of the OPD is formed, a chemical mechanical polishing (CMP) process may not be needed.

Figure 11:
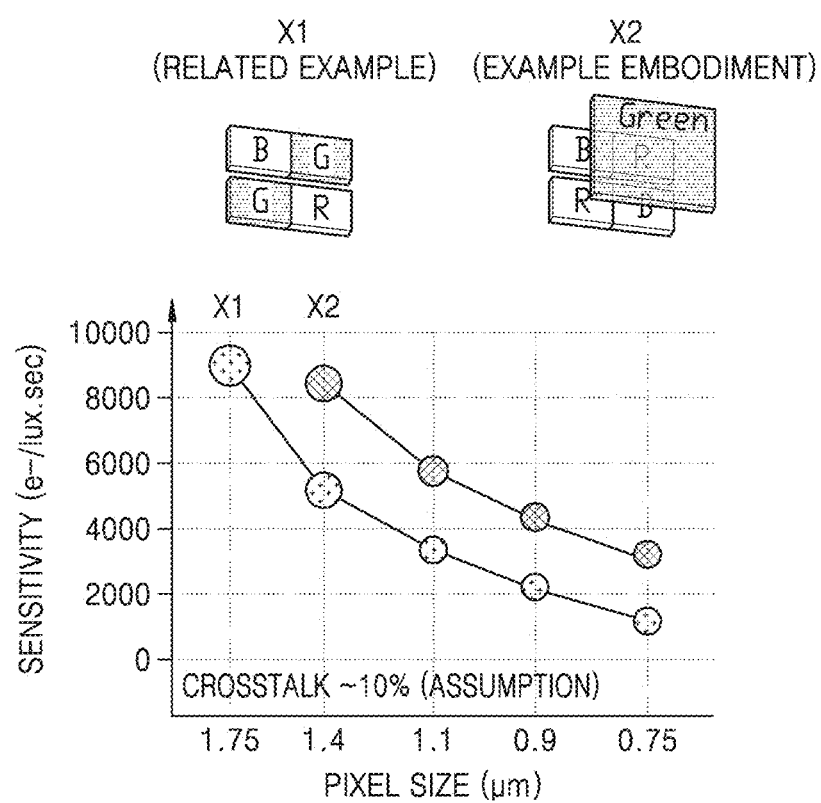
FIG. 11 is a graph showing a variation in sensitivity versus pixel size according to an arrangement of pixels according to an example embodiment.

FIG. 11 is a graph showing a variation in sensitivity versus pixel size according to an arrangement of pixels. Comparative example X1 represents a case in which R, G, B pixels are two-dimensionally arranged. Example embodiment X2 represents a case in which R, B pixels are two-dimensionally arranged and a G layer is arranged thereon. Comparative example X1 has a single-layer arrangement structure. Example embodiments X2 has a stacked structure.

Referring to FIG. 11, in comparative example X1, sensitivity decreased greatly as pixel size decreased. In particular, when pixel size decreased to about 1.0 μm or less, sensitivity decreased to a reference value or less, and thus signal intensity decreased. In contrast, in example embodiment X2, sensitivity decreased as pixel size decreased but a degree of sensitivity was far higher than that of sensitivity in comparative example X1. According to the example embodiment X2, even when pixel size decreased to about 1.0 µm or less, a degree of sensitivity was maintained greater than or equal to the reference value. According to example embodiments, example embodiment X2 or a stacked structure similar thereto may be employed, and thus an effect of increasing a light-receiving area and improving sensitivity may be obtained.

Figure 12:
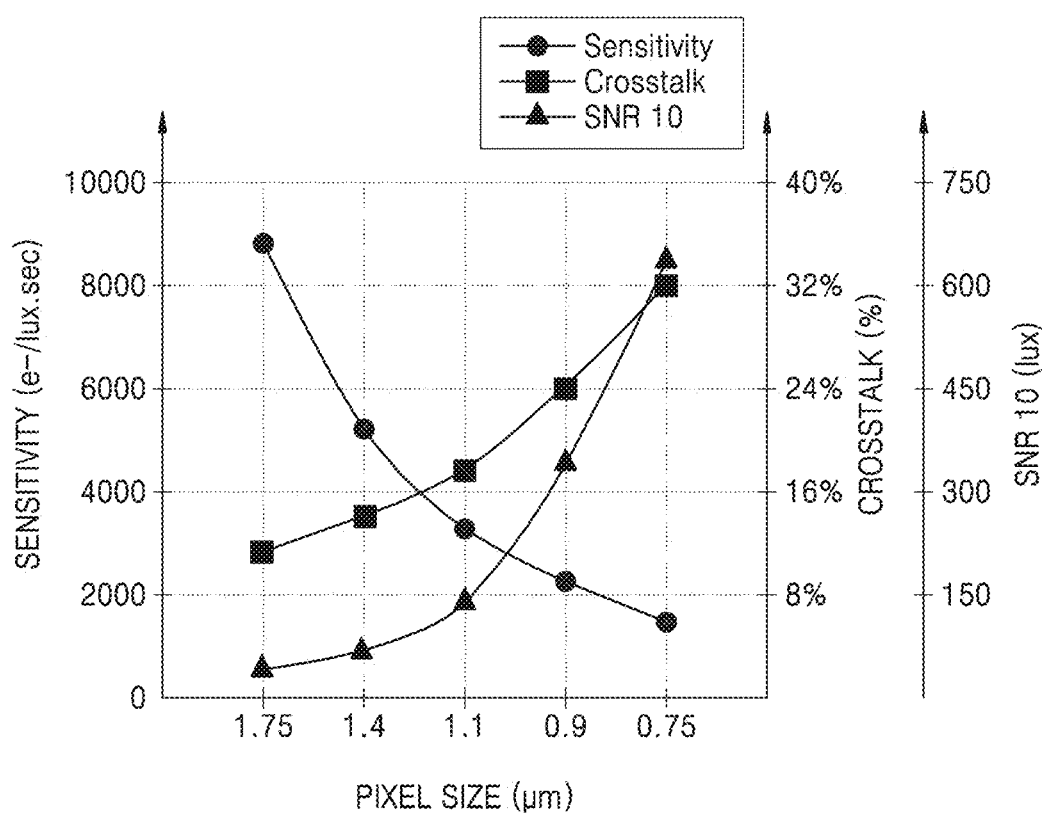
FIG. 12 is a graph showing a variation in sensitivity and crosstalk versus pixel size of an image sensor according to a related example.

FIG. 12 is a graph showing a variation in sensitivity and crosstalk according to a reduction in pixel size of an image sensor according to a comparative example.

Referring to FIG. 12, as pixel size decreases, sensitivity of an image sensor according to a comparative example decreases greatly and crosstalk increases greatly. SNR 10 represents signal statistics proportional to a noise level and increased greatly as pixel size decreased. In particular, when pixel size decreased to about 1.1 µm or less, the SNR 10 values changed to a great extent. Image sensors according to example embodiments may be capable of overcoming problems, such as a reduction in the intensity of a signal, a reduction in sensitivity, etc., caused by a reduction in pixel size.

FIGS. 13A to 13F are cross-sectional views illustrating a method of manufacturing an image sensor according to an example embodiment.

Figure 13A:
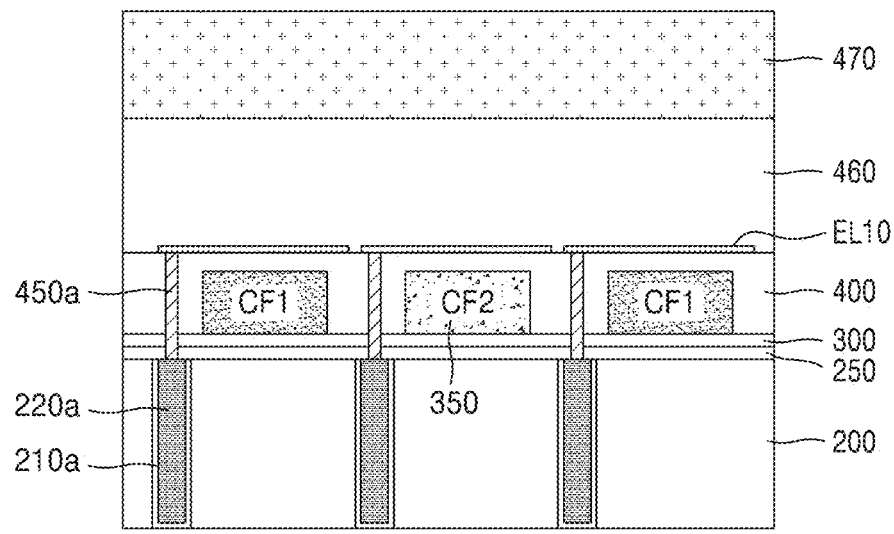
FIGS. 13A to 13F are cross-sectional views illustrating a method of manufacturing an image sensor according to an example embodiment.

Referring to FIG. 13A, a substrate layer including a plurality of light detection elements corresponding to a plurality of pixel regions and a plurality of transistors may be provided. A first insulating layer 200 may be formed on the substrate layer. A plurality of holes may be formed on the first insulating layer 200, and conductive adhesive layers 210a and contact plugs 220a may be formed in the plurality of holes in the first insulating layer 200.

An anti-reflective layer 250 may be formed on the first insulating layer 200, and a second insulating layer 300 may be formed on the anti-reflective layer 250. A plurality of color filters 350 may be formed on the second insulating layer 300. The plurality of color filters 350 may include first color filters CF1 and second color filters CF2. The first color filters CF1 and the second color filters CF2 may form a two-dimensional (2D) array. The first color filters CF1 may be red filters and the second color filters CF2 may be blue filters, but colors to be filtered by the first and second color filters CF1 and CF2 may vary. In some cases, the second insulating layer 300 may not be included and the plurality of color filters 350 may be formed on the anti-reflective layer 250.

A third insulating layer 400 may be formed on the plurality of color filters 350 to cover the plurality of color filters 350. The third insulating layer 400 may be formed of a transparent insulating material or a transparent dielectric material. A plurality of conductive plugs 450a may be formed in the third insulating layer 400 and the second insulating layer 300 to pass through the third insulating layer 400 and the second insulating layer 300. The plurality of conductive plugs 450a may be arranged to correspond to the plurality of pixel regions, and may be connected to the contact plugs 220a to be electrically connected to a plurality of first transistors.

A plurality of first electrode layers EL10 corresponding to the plurality of color filters 350 may be formed on the third insulating layer 400. After a transparent conductive oxide (TCO) layer is formed of an ITO, an IZO, an AZO, a GZO, an AGZO, or a GIZO, the TCO layer is patterned to form the plurality of first electrode layers EL10. The plurality of first electrode layers EL10 may be respectively connected to and in contact with the plurality of conductive plugs 450a.

An intermediate material layer 460 may be formed on the third insulating layer 400 to cover the plurality of first electrode layers EL10. The intermediate material layer 460 may be a lens material layer which will be patterned to form a micro-lens at a later time. The intermediate material layer 460 may be formed of a transparent insulating material such as a silicon oxide. For example, the intermediate material layer 460 may be formed of an LTO. The LTO may be, for example, an oxide formed at about 500° C. or less. In some cases, the intermediate material layer 460 may be formed of an organic material such as a polymer or other materials. A planarization layer 470 may be formed on the intermediate material layer 460. The planarization layer 470 may be a top planarization layer (TPL) and may be formed of an organic insulating film or an inorganic insulating film. In some cases, the planarization layer 470 may not be formed.

Figure 13B:
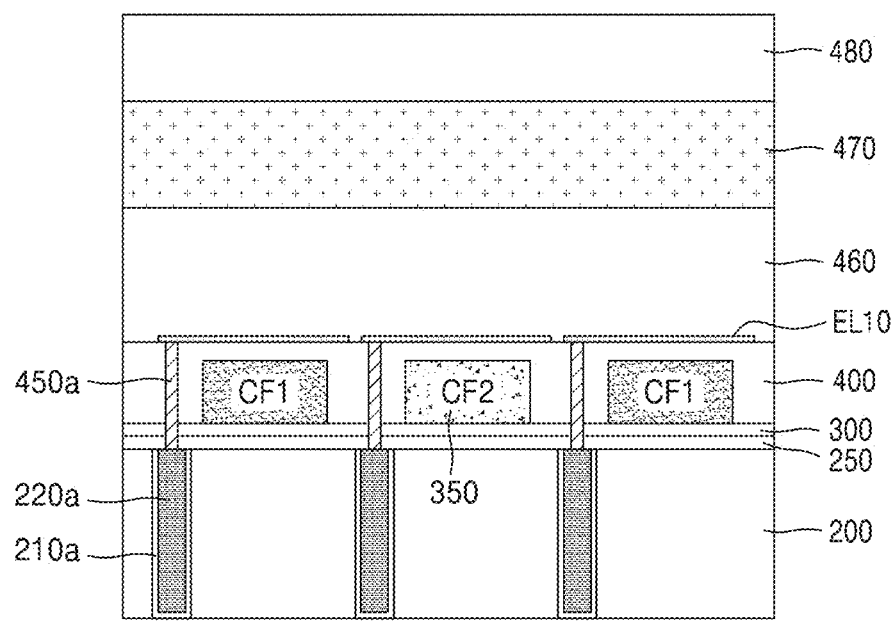

Referring to FIG. 13B, a mask material layer 480 may be formed on the planarization layer 470. The mask material layer 480 may be formed of an insulating material.

Figure 13C:
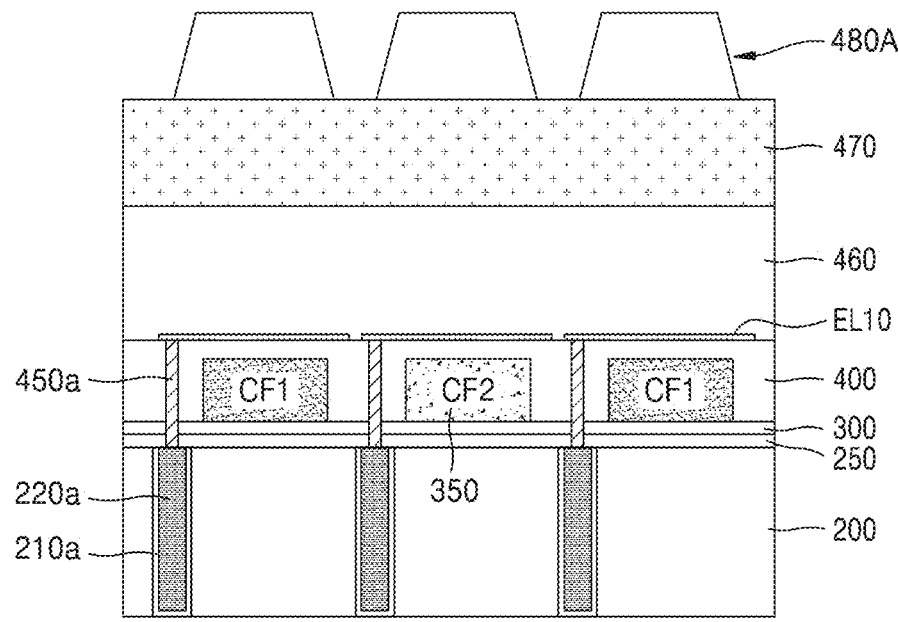

Referring to FIG. 13C, a mask pattern 480A may be formed by patterning the mask material layer 480.

Figure 13D:
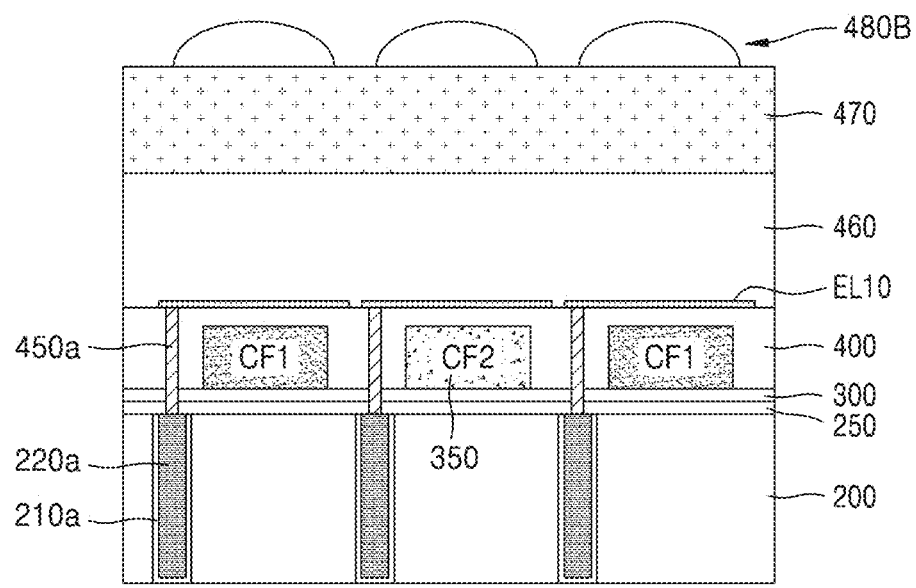

Referring to FIG. 13D, an etching process may be performed on the mask pattern 480A to modify a pattern of the mask pattern 480A similar to that of a micro-lens. The modified mask pattern is indicated by reference numeral 480B. The mask pattern 480B having lens-shaped patterns may be obtained by appropriately controlling conditions of an etching process. In this case, for example, wet etching and dry etching may be used.

Figure 13E:
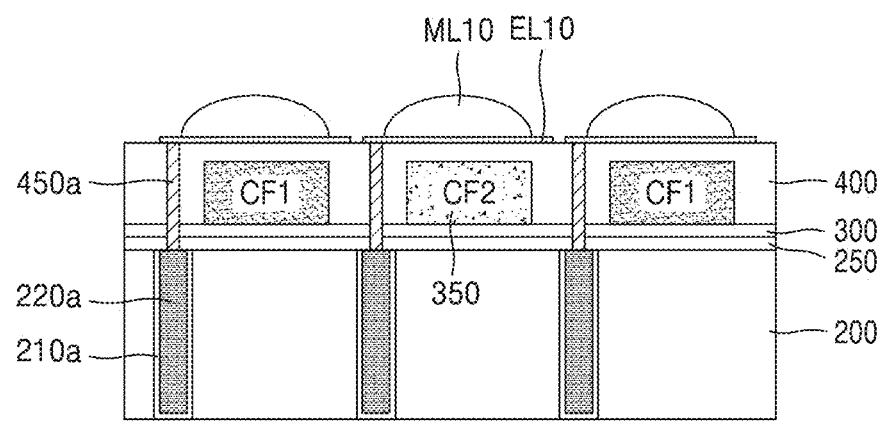

Next, a plurality of micro-lenses ML10 of FIG. 13E may be formed from the intermediate material layer 460 by sequentially patterning the planarization layer 470 and the intermediate material layer 460 by using the mask pattern 480B as an etch mask. The plurality of formed micro-lenses ML10 are illustrated in FIG. 13E.

Referring to FIG. 13E, the plurality of micro-lens ML10 may be formed from the intermediate material layer 460 of FIG. 13D. The plurality of micro-lens ML10 may be respectively located on the plurality of first electrode layers EL10.

Figure 13F:
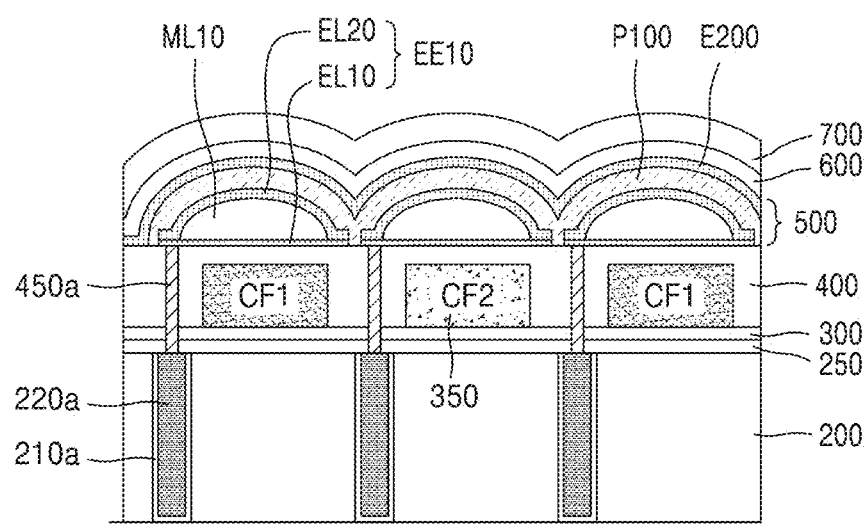

Referring to FIG. 13F, a plurality of second electrode layers EL20 may be formed on the plurality of micro-lens ML10. The plurality of second electrode layers EL20 may be respectively in contact with the plurality of first electrode layers EL10 corresponding thereto. The plurality of second electrode layers EL20 may be formed of a transparent conductive oxide. Next, an organic material-based photodiode layer P100 covering the plurality of second electrode layers EL20 may be formed, and a second electrode E200 may be formed on the photodiode layer P100. The photodiode layer P100 and the second electrode E200 may have a continuous layer structure covering the plurality of color filters 350. The second electrode E200 may be in contact with a second conductive plug to be electrically connected to a second transistor of a substrate part.

The plurality of first electrode elements EE10, the photodiode layer P100, and the second electrode E200 may form a photodiode device portion 500. Each of the first electrode element EE10 may include a first electrode layer EL10 and a second electrode layer EL20, and a micro-lens ML10 may be provided between the first and second electrode layers EL10 and EL20. The photodiode device portion 500 may have a curved convex structure corresponding to each of the pixel regions.

Next, encapsulation layers 600 and 700 covering the photodiode device portion 500 may be formed. The encapsulation layers 600 and 700 may include at least two different material layers. For example, the encapsulation layers 600 and 700 may include a first encapsulation layer 600 and a second encapsulation layer 700 formed of a material different from that of the first encapsulation layer 600. For example, the first encapsulation layer 600 may be formed of an aluminum oxide, e.g., Al2O3, and the second encapsulation layer 700 may be formed of a silicon oxynitride (SiON). Encapsulation performance may be improved due to such a two-layer structure or a multi-layer structure. The encapsulation layers 600 and 700 may have curved surfaces corresponding to a curved structure of the photodiode device portion 500. Thus, the encapsulation layers 600 and 700 may also function as a micro-lens, and thus an additional micro-lens may not need to be additionally provided thereon. Accordingly, a manufacturing process may be simplified and light-collection/focus characteristics may be improved.

According to an example embodiment, a material of the micro-lens ML10, i.e., a material of the intermediate material layer 460 of FIG. 13A, may be a transparent conductor or a transparent polymer instead of an oxide. When the intermediate material layer 460 is a transparent conductor, the plurality of first electrode layers EL10 may not be formed. A plurality of first electrode elements having a shape of a micro-lens may be formed using the intermediate material layer 460. In this case, a plurality of first electrode elements EE13 as illustrated in FIG. 5 may be formed.

According to example embodiments, a micro-lens having a plurality of convex portions for one pixel region may be formed by controlling a shape and number of the patterns of the mask pattern 480B of FIG. 13D. In this case, first electrode elements EE12 and EE14 as illustrated in FIG. 4 or 6 may be formed.

According to the example method of FIGS. 13A to 13F, a peripheral region R20 may be formed while forming an active region R10 illustrated in FIG. 1. A method of forming the peripheral region R20 will be apparent from the above method and is thus not described here.

Figure 14:
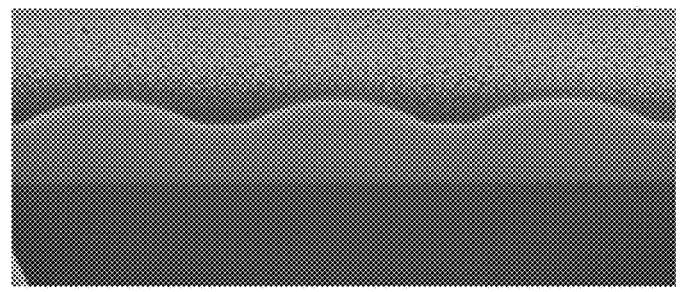
FIG. 14 is a side-view image showing a structure of a micro-lens formed according to an example embodiment.

FIG. 14 is a side-view image showing a structure of a micro-lens formed according to an example embodiment.

Figure 15A:
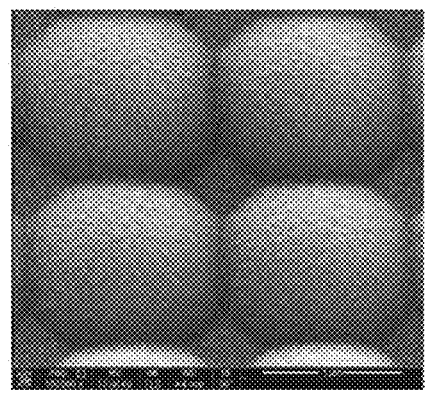
FIGS. 15A and 15B illustrate images of an image sensor having a curved organic photodiode (OPD) formed according to an example embodiment.
Figure 15B:
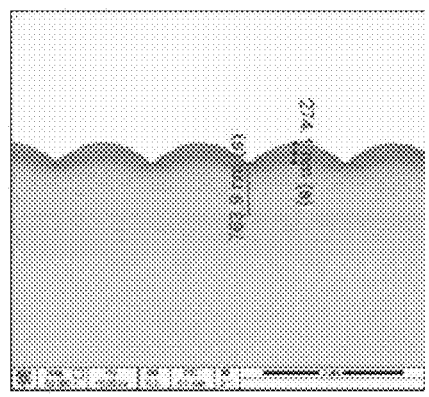

FIGS. 15A and 15B illustrate images of an image sensor having a curved OPD formed according to an example embodiment. FIG. 15A is a top view and FIG. 15B is a side view.

According to an example embodiment, a device may be manufactured by stacking two or more OPD devices each having a curved structure. First, a first curved OPD device may be formed, a planarization layer may be formed on the first curved OPD device, and a second curved OPD device may be formed on the planarization layer. Here, for example, a low-temperature spin-on-glass (SOG) layer or the like may be used as the planarization layer. According to an example embodiment, an arrangement of a plurality of light detection elements 150 may vary and arrangements of a plurality of transistors 110 and 120 and the plurality of light detection elements 150 may vary. For example, although FIG. 1 illustrates that the plurality of transistors 110 and 120 and the plurality of light detection elements 150 are located at the same level, they may be arranged on different levels. In addition, various modifications may be made in an image sensor according to an embodiment.

Image sensors according to various embodiments are applicable to various types of imaging devices. Image sensors according to various embodiments are applicable to various types of imaging devices employing the existing image sensors. A structure of an imaging device including an image sensor is well known and is thus not described in detail here.

While many matters are described in detail in the present disclosure, the scope of the present disclosure is not limited by the matters but the matters should be understood as examples. For example, it will be apparent to those of ordinary skill in the art that various changes may be made in the structures of the image sensors described above with reference to FIGS. 1 to 6 and the method of manufacturing an image sensor, described above with reference to FIGS. 13A to 13F. For example, in FIG. 1, the first electrode layer EL10 may not be used but the second electrode layer EL20 may be configured to be in direct contact with the first conductive plug 450a. In addition, the shape of the micro-lens ML10 and the structure of the photodiode device portion 500 formed thereon may be changed variously. Accordingly, the scope of the present disclosure should be defined not by example embodiments set forth herein but by the technical idea defined in the appended claims.

What is claimed is:

1. An image sensor comprising:
   a plurality of light detection elements arranged to correspond to a plurality of pixel regions;
   a color filter layer arranged on the plurality of light detection elements, the color filter layer comprising a plurality of color filters arranged to correspond to the plurality of light detection elements; and
   a photodiode device portion arranged on the color filter layer, the photodiode device portion comprising a plurality of curved convex structures respectively corresponding to the plurality of color filters,
   wherein the photodiode device portion comprises:
      an organic material-based photodiode layer;
      a first electrode arranged between the photodiode layer and the color filter layer; and
      a second electrode arranged on the photodiode layer, and
   wherein the first electrode comprises a plurality of first electrode elements patterned to correspond to each of the plurality of pixel regions, each of the plurality of first electrode elements comprising:
      a first electrode layer having a flat structure;
      a second electrode layer having a curved structure corresponding to a pixel region, the second electrode layer being in direct contact with the first electrode layer; and
      a micro-lens between the first electrode layer and the second electrode layer.

2. The image sensor of claim 1, wherein the first electrode comprises a plurality of first electrode elements patterned to correspond to each of the plurality of pixel regions; and
   the photodiode layer and the second electrode comprising a continuous layer structure, respectively, arranged on the plurality of color filters.

3. The image sensor of claim 2, wherein the color filter layer further comprises a plurality of first conductive plugs and a second conductive plug,
   wherein the plurality of first conductive plugs are respectively arranged in the plurality of pixel regions, and the second conductive plug is spaced apart from the plurality of first conductive plugs,
   the plurality of first electrode elements are respectively connected to the plurality of first conductive plugs, and the second electrode is connected to the second conductive plug.

4. The image sensor of claim 1, wherein the micro-lens comprises a low-temperature oxide (LTO).

5. The image sensor of claim 1, wherein the first electrode layer and the second electrode layer are in contact with each other at a first side of the micro-lens while overlapping each other by a first width,
the first electrode layer and the second electrode layer are in contact with each other at a second side of the micro-lens while overlapping each other by a second width or are not in contact with each other at the second side of the micro-lens.

6. The image sensor of claim 5, wherein the first width is equal to or greater than the second width.

7. The image sensor of claim 1, wherein the first electrode comprises a plurality of first electrode elements patterned to correspond to each of the plurality of pixel regions,
wherein a curved convex surface corresponding to one of the plurality of pixel regions is provided as a top surface of each of the plurality of first electrode elements.

8. The image sensor of claim 7, wherein the plurality of first electrode elements comprises a single body structure.

9. The image sensor of claim 1, wherein the first electrode comprises a plurality of first electrode elements patterned to correspond to each of the plurality of pixel regions,
wherein a plurality of curved convex surfaces corresponding to one of the plurality of pixel regions are provided as a top surface of each of the plurality of first electrode elements.

10. The image sensor of claim 9, wherein the plurality of first electrode elements comprises a single body structure.

11. The image sensor of claim 1, further comprising an encapsulation layer covering the photodiode device portion,
wherein the encapsulation layer comprises at least two different material layers and comprises curved surfaces corresponding to the curved convex structures of the photodiode device portion.

12. The image sensor of claim 1, wherein the plurality of color filters comprise a first color filter and a second color filter,
wherein the first color filter comprises a red filter, the second color filter comprises a blue filter, and the photodiode layer comprises a green-sensing photodiode layer.

13. The image sensor of claim 1, wherein the plurality of light detection elements comprise a plurality of silicon-based photodiodes.

14. The image sensor of claim 1, wherein the image sensor comprises a complementary metal oxide semiconductor (CMOS) image sensor.

15. The image sensor of claim 1, further comprising:
a substrate portion comprising a plurality of transistors, and
a connection wiring layer between the substrate portion and the color filter layer,
wherein at least some of the plurality of transistors are electrically connected to the photodiode device portion.

16. An imaging device comprising the image sensor of claim 1.

17. The image sensor of claim 4, wherein a curved structure of the second electrode layer comprises a plurality of curved convex surfaces.

18. The image sensor of claim 1, wherein the first electrode and the second electrode comprises a transparent conductive oxide.

19. The image sensor of claim 1, wherein the second electrode has a plurality of curved structures corresponding to the plurality of color filters, and covers the plurality of color filters as a single layer.

20. A method of manufacturing an image sensor, the method comprising:
preparing a substrate layer comprising a plurality of light detection elements corresponding to a plurality of pixel regions;
forming a color filter layer on the substrate layer, the color filter layer comprising a plurality of color filters arranged to correspond to the plurality of light detection elements; and
forming a photodiode device portion on the color filter layer, the photodiode device portion comprising curved convex structures respectively corresponding to the plurality of color filters;
wherein the forming of the photodiode device portion comprises:
forming a first electrode comprising curved structures arranged on the color filter layer;
forming an organic material-based photodiode layer on the first electrode; and
forming a second electrode on the photodiode layer,
wherein the forming of the first electrode comprises forming the first electrode comprising a plurality of first electrode elements patterned corresponding to each of the plurality of pixel regions, each of the plurality of first electrode elements comprising:
a first electrode layer having a flat structure;
a second electrode layer comprising a curved structure and in direct contact with the first electrode layer; and
a micro-lens between the first electrode layer and the second electrode layer.

21. The method of claim 20, wherein the forming of the first electrode comprises forming the first electrode comprising a plurality of first electrode elements patterned corresponding to each of the plurality of pixel regions, and
the forming of the photodiode layer and the forming of the second electrode comprise forming the photodiode layer and the second electrode comprising a continuous layer structure, respectively, arranged on the plurality of color filters.

22. The method of claim 21, further comprising forming a plurality of first conductive plugs and a second conductive plug in the color filter layer such that the plurality of first conductive plugs are respectively arranged in the plurality of pixel regions and the second conductive plug is spaced apart from the plurality of first conductive plugs,
wherein the plurality of first electrode elements are formed respectively connected to the plurality of first conductive plugs, and
the forming of the second electrode comprising the continuous layer structure comprises forming the second electrode connected to the second conductive plug.

23. The method of claim 20, further comprising:
forming a plurality of first electrode layers on the color filter layer, the plurality of first electrode layers respectively corresponding to the plurality of color filters;
forming an intermediate material layer on the plurality of first electrode layers;
forming a mask pattern on the intermediate material layer;
forming a plurality of micro-lenses on the plurality of first electrode layers by patterning the intermediate material layer by using the mask pattern as an etch mask;
forming a plurality of second electrode layers on the plurality of micro-lenses;
forming the photodiode layer on the plurality of second electrode layers; and
forming the second electrode on the photodiode layer.

24. The method of claim 23, wherein the intermediate material layer comprises a low-temperature oxide (LTO).

25. The method of claim 20, wherein the forming of the first electrode comprises forming the first electrode comprising a plurality of first electrode elements patterned corresponding to each of the plurality of pixel regions,
   wherein each of the plurality of first electrode elements is formed comprising a curved convex surface as a top surface, the curved convex surface corresponding to one of the plurality of pixel regions.

26. The method of claim 20, wherein the forming of the first electrode comprises forming the first electrode comprising a plurality of first electrode elements patterned corresponding to each of the plurality of pixel regions,
   wherein each of the plurality of first electrode elements is formed comprising a plurality of curved convex surfaces as a top surface, the plurality of curved convex surfaces corresponding to one of the plurality of pixel regions.

27. The method of claim 20, further comprising forming an encapsulation layer covering the photodiode device portion,
   wherein the encapsulation layer comprises at least two different material layers and comprises curved surfaces corresponding to the curved convex structures of the photodiode device portion.

* * * * *